United States Patent
Ray et al.

(10) Patent No.: US 9,490,407 B2
(45) Date of Patent: Nov. 8, 2016

(54) PROCESS FOR FORMING ULTRA-MICRO LEDS

(71) Applicant: Nthdegree Technologies Worldwide Inc., Tempe, AZ (US)

(72) Inventors: William Johnstone Ray, Fountain Hills, AZ (US); Mark David Lowenthal, Vancouver, WA (US); Lixin Zheng, Kirkland, WA (US)

(73) Assignee: Nthdegree Technologies Worldwide Inc., Tempe, AZ (US)

( * ) Notice: Subject to any disclaimer, the term of this patent is extended or adjusted under 35 U.S.C. 154(b) by 0 days.

(21) Appl. No.: 15/007,126

(22) Filed: Jan. 26, 2016

(65) Prior Publication Data

US 2016/0141471 A1    May 19, 2016

Related U.S. Application Data

(62) Division of application No. 14/616,347, filed on Feb. 6, 2015, now Pat. No. 9,281,298.

(60) Provisional application No. 61/938,079, filed on Feb. 10, 2014.

(51) Int. Cl.

| H01L 29/06 | (2006.01) |
|---|---|
| H01L 33/56 | (2010.01) |
| H01L 25/075 | (2006.01) |
| H01L 33/06 | (2010.01) |

(Continued)

(52) U.S. Cl.
CPC ............ *H01L 33/56* (2013.01); *H01L 25/0753* (2013.01); *H01L 33/06* (2013.01); *H01L 33/32* (2013.01); *H01L 33/405* (2013.01);
(Continued)

(58) Field of Classification Search
USPC ................ 257/13, 79, 88, E31.099, E31.105
See application file for complete search history.

(56) References Cited

U.S. PATENT DOCUMENTS

| 2002/0096254 A1 | 7/2002 | Kober et al. |
| 2006/0045959 A1 | 3/2006 | Yasukawa |

(Continued)

FOREIGN PATENT DOCUMENTS

| TW | 200308180 A | 12/2003 |
| TW | 200952573 A | 12/2009 |
| WO | 2014123734 A1 | 8/2014 |

OTHER PUBLICATIONS

EPO as ISA for PCT/US2015/015018, "International Search Report and Written Opinion," Apr. 10, 2015, 13 pages.

*Primary Examiner* — Timor Karimy
(74) *Attorney, Agent, or Firm* — Patent Law Group; Brian D. Ogonowsky

(57) ABSTRACT

A flexible light sheet includes a bottom conductor layer overlying a flexible substrate. An array of vertical light emitting diodes (VLEDs) is printed as an ink over the bottom conductor layer so that bottom electrodes of the VLEDs electrically contact the bottom conductor layer. A top electrode of the VLEDs is formed of a first transparent conductor layer, and a temporary hydrophobic layer is formed over the first transparent conductor layer. A dielectric material is deposited between the VLEDs but is automatically de-wetted off the hydrophobic layer. The hydrophobic layer is then removed, and a second transparent conductor layer is deposited to electrically contact the top electrode of the VLEDs. The VLEDs can be made less than 10 microns in diameter since no top metal bump electrode is used. The VLEDs are illuminated by a voltage differential between the bottom conductor layer and the second transparent conductor layer.

8 Claims, 3 Drawing Sheets

(51) Int. Cl.
*H01L 33/32* (2010.01)
*H01L 33/40* (2010.01)
*H01L 33/42* (2010.01)
*H01L 33/48* (2010.01)
*H01L 33/62* (2010.01)

(52) U.S. Cl.
CPC ............ *H01L 33/42* (2013.01); *H01L 33/486* (2013.01); *H01L 33/62* (2013.01); *H01L 2924/0002* (2013.01); *H01L 2933/0016* (2013.01); *H01L 2933/0066* (2013.01)

(56) References Cited

U.S. PATENT DOCUMENTS

| | | |
|---|---|---|
| 2006/0202943 A1 | 9/2006 | Hillis et al. |
| 2007/0279377 A1 | 12/2007 | Hillis et al. |
| 2009/0173954 A1 | 7/2009 | Beeson et al. |
| 2009/0265929 A1 | 10/2009 | Nakagawa et al. |
| 2012/0164796 A1 | 6/2012 | Lowenthal et al. |
| 2014/0191202 A1* | 7/2014 | Shim .................. H01L 51/5265 257/40 |

* cited by examiner

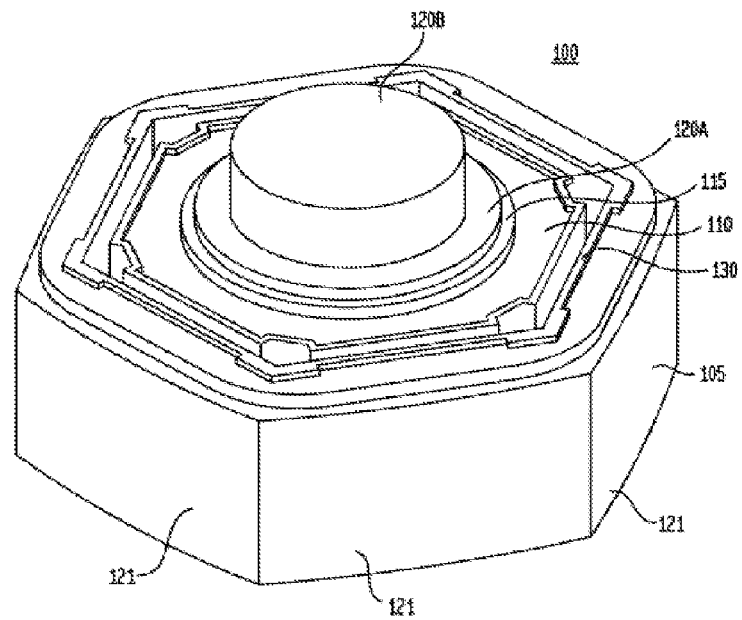
Fig. 1 (prior art)
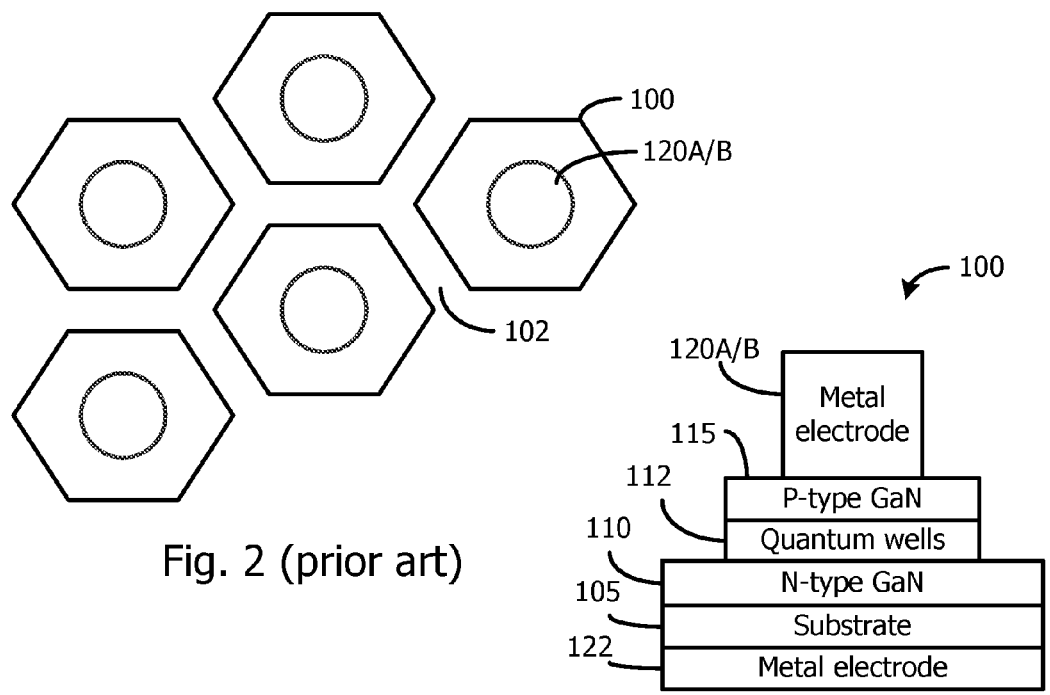
Fig. 2 (prior art)
Fig. 3 (prior art)

PROCESS FOR FORMING ULTRA-MICRO LEDS

CROSS-REFERENCE TO RELATED APPLICATIONS

This application is a divisional of U.S. application Ser. No. 14/616,347, filed Feb. 6, 2015, by William Johnstone Ray et al., which claims priority to US provisional application Ser. No. 61/938,079, filed Feb. 10, 2014, assigned to the present assignee and incorporated herein by reference.

FIELD OF THE INVENTION

This invention relates to forming ultra-micro (e.g., less than 20 microns) vertical light emitting diodes (LEDs) and, in particular, to forming a thin light sheet containing such LEDs.

BACKGROUND

It is well known in the field of LEDs that efficiency is generally improved as the LED die becomes smaller. For example, in the paper by Choi et al. entitled Mechanism of Enhanced Light Output Efficiency In InGaN-Based Micro-light Emitting Diodes, Journal of Applied Physics, volume 93, number 10, 15 May 2003, Choi presents data showing the optical power density vs. current of an LED die increases about three fold when reducing the size of a micro-LED from 20 microns in diameter to 8 microns in diameter.

The present inventors had previously developed a technique for printing microscopic LEDs and connecting the LEDs in parallel. The LEDs are vertical LEDs with one electrode on top and the other electrode on the bottom. Each LED die has a diameter of about 30 microns and a thickness of about 7 microns.

FIG. 1 is a perspective view of one embodiment of the inventors' previously developed vertical LED 100, directly reproduced from U.S. Patent Application Publication 2013/0168658, incorporated herein by reference. As described below, the basic LED design has an inherent limitation that prevents it from being significantly smaller than 30 microns.

FIG. 2 is a top down view of the hexagonal LEDs 100 on a carrier wafer prior to singulation. The LEDs 100 are separated by trenches 102.

FIG. 3 is a simplified cross-sectional view of the LED 100.

An elongated metal top electrode 120B and its metal base 120A conduct current to the underlying p-type GaN layer 115. A bottom electrode (FIG. 3) 122 is formed on the bottom surface of a conductive substrate 105 (which may be n-GaN) to provide current to the overlying n-type GaN layer 110. At the junction of the p and n-type layers are light-generating quantum wells 112 (FIG. 3). The epitaxially grown LED semiconductor layers may be conventional. A metal via 130 (FIG. 1) may be used to bypass any low conductivity layers formed over the bottom electrode 122. The LED 100 is formed as a hexagon with sides 121.

The singulated LEDs 100 are designed to be suspended in an LED ink and printed over a substrate having a "bottom" conductor layer. A vast majority of the LED will have the same orientation. The bottom electrode 122 of the LED 100 contacts the bottom conductor layer. A dielectric layer is then deposited to insulate the bottom conductor layer and cover the sides of the LEDs yet expose the elongated top electrode 120B of the LEDs. A top conductor layer is then deposited to contact the top electrode 120B and connect the printed LEDs 100 in parallel. Either the top conductor layer or the bottom conductor layer, or both, are formed of a transparent conductor material so light exits one or both surfaces of the resulting light sheet.

The size of the LED 100 is limited by the smallest practical size of the top electrode 120B and its metal base 120A, which is roughly the relative size shown in FIG. 1. The top electrode 120A/B obscures and absorbs a substantial portion of the generated light. By making the LED die's diameter smaller, while the size of the top electrode 120A/B remains the same, there will be less light-generating area, and a higher percentage of the generated light will be obscured by the top electrode 120A/B, so efficiency drops.

Therefore, what is needed is a technique to form LED dies substantially smaller than 30 microns, to obtain an improved optical power output density vs. current, which are printable for manufacturing thin, flexible light sheets.

SUMMARY

A process for forming ultra-micro printable LEDs and a light sheet are described.

After the LED layers have been epitaxially grown in an LED wafer, a transparent conductor layer (e.g., ITO) is formed over the top LED layer, which will typically be a p+GaN-based layer. The LED wafer is then etched to form trenches to define the boundaries of each LED die on the wafer. In one embodiment, the LEDs are generally hexagonal with a diameter of about 8-10 microns.

While still in wafer form, the top surfaces of the LEDs are processed to be hydrophobic or super-hydrophobic. A hydrophobic surface causes water to bead up on a surface or pull away from a surface. This may be accomplished by forming a thin fluorine-based layer on the surface, such as by using a printing process, spraying, or a CVD process. Fluorocarbons, fluoropolymers, and similar substances are commonly used for creating water-repellant surfaces, such as on garments, and the hydrophobic layer may be very thin. These materials are also referred to as fluorosurfactants and are commercially available. The ITO layer itself may be fluorine-treated to be hydrophobic rather than depositing an additional layer over the ITO.

The LEDs are then singulated and released in an aqueous media to form an LED ink.

The LEDs are then printed on a conductive surface of a substrate so that the LEDs' bottom electrodes contact the conductive surface. The LED ink is then cured to evaporate the media.

A liquid dielectric is then printed over the monolayer of LEDs to cover the exposed conductive surface and the sides of the LEDs. The dielectric is hydrophilic. The dielectric pulls off the hydrophobic surfaces of the LEDs by surface tension.

The hydrophobic layer is then neutralized or removed by a blanket etching step to expose the ITO.

A top conductor layer is then deposited to directly contact the exposed ITO layer. This connects all the printed LEDs in parallel in the resulting light sheet. Connecting a suitable driving voltage across the conductor layers energizes all the LED having the proper orientation. Either the top conductor layer, the bottom conductor layer, or both can be transparent to allow light to exit. The substrate is preferably a transparent PET.

As seen, there is no metal electrode bump on the top surface of the LEDs so there is no blockage of light from such an electrode.

Since the transparent top conductor material covers the entire top surface of the LED, there is excellent current spreading, and the light-generating area of the LED is maximized with no blockage of light. Therefore, the efficiency of the LED is greatly improved.

Further, the small size of the LED allows a higher density of the printed point sources of light in the light sheet to create a more uniform illumination across the light sheet.

A phosphor layer may be deposited over the light emitting surface of the light sheet to create any color light, such as white.

Other embodiments are described.

BRIEF DESCRIPTION OF THE DRAWINGS

FIG. 1 is a perspective view of the inventors' previous printable LED design.

FIG. 2 is top down view of the hexagonal LEDs on a carrier wafer after trenches have been etched and prior to singulation.

FIG. 3 is a schematic cross-sectional view of the LED of FIG. 1.

Elements that are similar or identical in the various figures are labeled with the same numeral.

DETAILED DESCRIPTION

Figure 4:
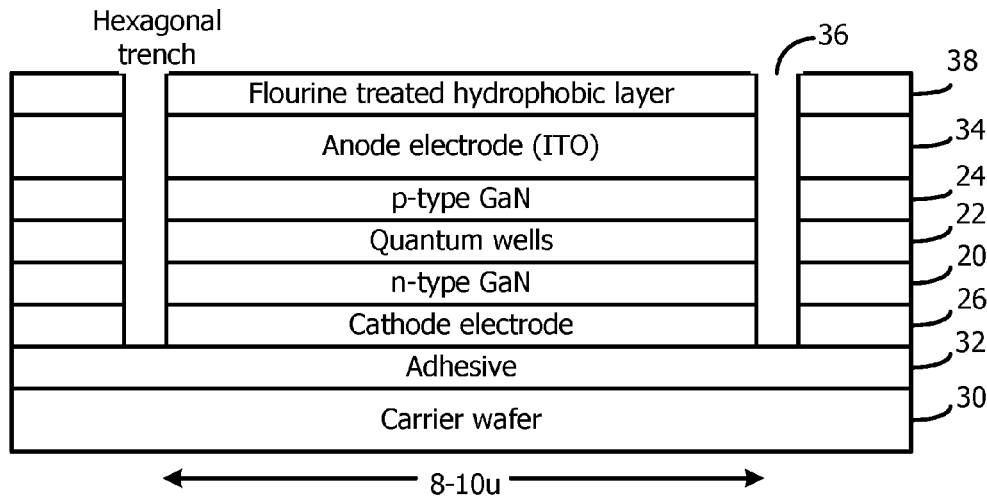
FIG. 4 is a cross-sectional view of the LEDs on a carrier wafer with a hydrophobic top layer prior to singulation, in accordance with one embodiment of the invention, where the LEDs are 8-10 microns wide.

FIG. 4 illustrates a very small portion of an LED wafer prior to singulation. The LEDs may have a hexagonal shape or any other suitable shape. Most of the fabrication steps may be identical to those described in detail in the inventors' U.S. Patent Application Publication 2013/0168658, incorporated herein by reference.

Generally, for GaN-based heterojunction LEDs that emit blue light, the starting substrate (not shown) may be sapphire. The conventional buffer layers, n-GaN layers 20, quantum wells 22, and p-GaN layers 24 are epitaxially grown over the substrate. The top surface of the LED wafer, which is the p-type GaN layer 24, is then affixed by a first adhesive layer (not shown) to a first carrier wafer (not shown) and the sapphire substrate is removed, such as by laser lift-off or any other suitable technique. The exposed semiconductor layer may be thinned to remove damage and improve the vertical conductivity of the LED. A cathode electrode 26, which may be a reflective metal or a transparent conductor, is then deposited on the exposed surface. The top surface of the LED wafer, which is the electrode 26 surface, is then affixed to a second carrier wafer 30 by a second adhesive layer 32, and the first carrier wafer is removed by dissolving the first adhesive layer or etching away the first carrier wafer.

An anode electrode 34 is then deposited, such as by printing or spraying, over the p-type GaN layer 24 to make electrical contact and is cured. In the preferred embodiment, the anode electrode 34 is a transparent conductor such as ITO or sintered silver nanowires.

Using a mask, trenches 36 are etched through the layers down to the second adhesive layer 32 to define the boundaries of the LED dies on the wafer. The LED dies will have a width of about 8-10 microns. The width is selected to maximize the efficiency of an ultra-micro LED while enabling high reliability fabrication of the LED dies. Larger or smaller LED sizes can be used. The thickness of the LEDs is on the order of about 7 microns.

Figure 7:
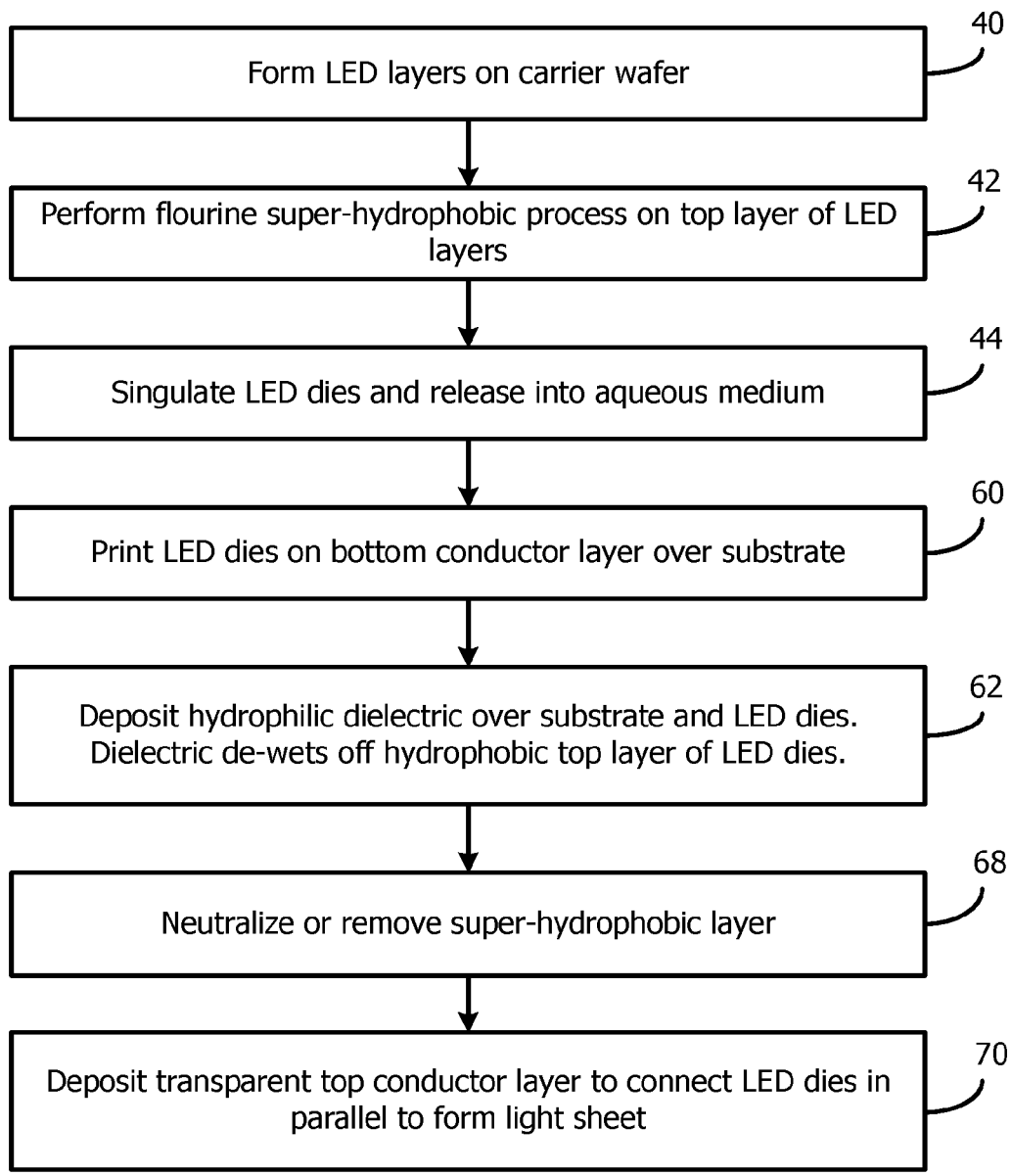
FIG. 7 is a flowchart identifying various steps used to create the light sheet of FIG. 6.

The previous steps are contained in step 40 in the flowchart of FIG. 7.

The anode electrode 34 is then treated with a fluorine process to create a thin hydrophobic layer 38. This may be done in a CVD process to form a fluorocarbon layer or fluoropolymer layer, or any other suitable hydrophobic layer, or may simply be done by depositing a thin layer of a commercially obtained fluorosurfactant material that is typically used for creating water repellant surfaces. Depositing the hydrophobic layer 38 may be done using printing, spraying, or other suitable process. Forming a super-hydrophobic surface is preferred. This process may be performed before or after the trenches 36 are formed.

Forming the hydrophobic top layer is identified as step 42 in FIG. 7.

The resulting LED dies are singulated by either dissolving the second adhesive layer 32 by immersing the wafer in a solvent or by etching or grinding off the carrier wafer 30 until the trenches 36 are reached.

The singulation may be performed in an aqueous medium so the LED dies become uniformly dispersed in the medium to form an LED ink. The LED ink may include a viscosity-modifying polymer resin to form an LED ink suitable for printing using screen printing, flexographic printing, gravure printing, or any other suitable deposition method, including spraying, etc. The ink is to be printed in a thin layer so the LED dies form a monolayer of a predictable density and are randomly but generally uniformly distributed on the printed surface. In one embodiment, the LED dies are printed so that there is an average of about one LED die per square millimeter.

Singulating the LED dies and releasing the dies into the aqueous medium is identified as step 44 in FIG. 7.

The printing process and light sheet formation process will now be described with respect to FIGS. 5 and 6 and the flowchart of FIG. 7.

Figure 5:
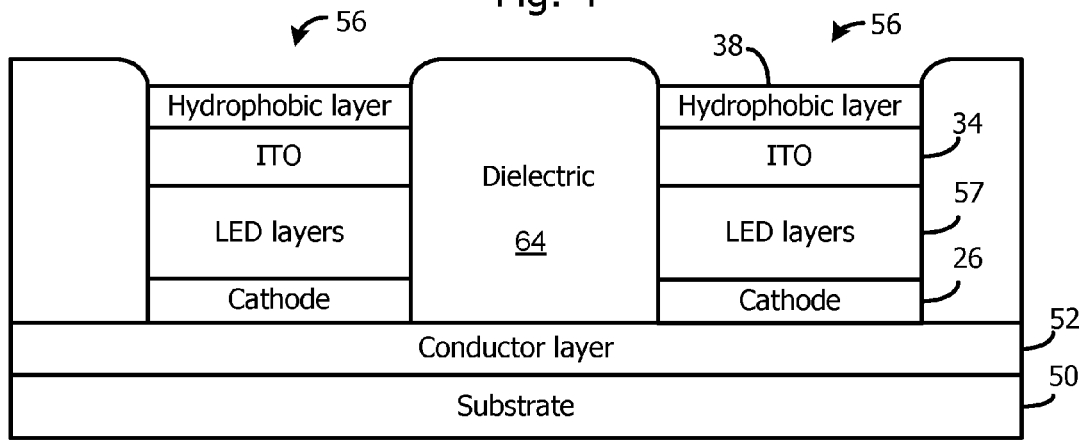
FIG. 5 is a cross-sectional view of a small portion of a light sheet during fabrication, where the singulated LEDs have been printed over a substrate and where a liquid dielectric material is shown de-wetted from the hydrophobic top surface of the LEDs.

In FIG. 5, a thin, flexible substrate 50, such as a PET film on a roll, is provided. Mylar, PMMA, or other suitable films may be used instead. The substrate 50 may be on the order of a few mils.

The substrate 50 on the roll may be provided with a conductor layer 52, or the conductive layer 52 may be deposited on the substrate 50, such as by printing, spraying, etc., as the substrate 50 is being unrolled in a roll-to-roll process. The conductor layer 52 may be a reflective metal or may be a transparent conductor such as ITO or sintered silver nanowires.

The LED dies 56 are then printed over the conductor layer 52 to form a monolayer of LED dies 56, and the ink is then cured, such as by lamps, to evaporate the aqueous medium. This is identified as step 60 of FIG. 7. If the LED dies 56 are properly oriented, the cathode electrode 26 will electrically contact the conductor layer 52. Any LED dies 56 that are not properly oriented will not affect the operation of the light sheet. The semiconductor LED layers are identified with the numeral 57. In one embodiment, the relatively heavy metal bottom electrode of the LEDs helps properly orient the LEDs as the LEDs settle on the conductor layer 52. In another embodiment, the shapes of the LEDs are designed to properly orient the LEDs on the conductor layer 52.

In step 62, a liquid hydrophilic dielectric material 64 is deposited over the LED dies 56 and the conductor layer 52 to a thickness about equal to the tops of the LED dies 56. The dielectric material 64 may be transparent or contains light-diffusing particles. Hydrophilic dielectric materials are commercially available and generally have the de-wetting characteristics of water relative to a hydrophobic surface. Deposition may be by printing, spraying, etc.

As shown in FIG. 5, the dielectric material 64 pulls off the top surfaces of the LED dies 56 by surface tension to expose the entire hydrophobic layer 38. The dielectric material 64 is then cured.

Figure 6:
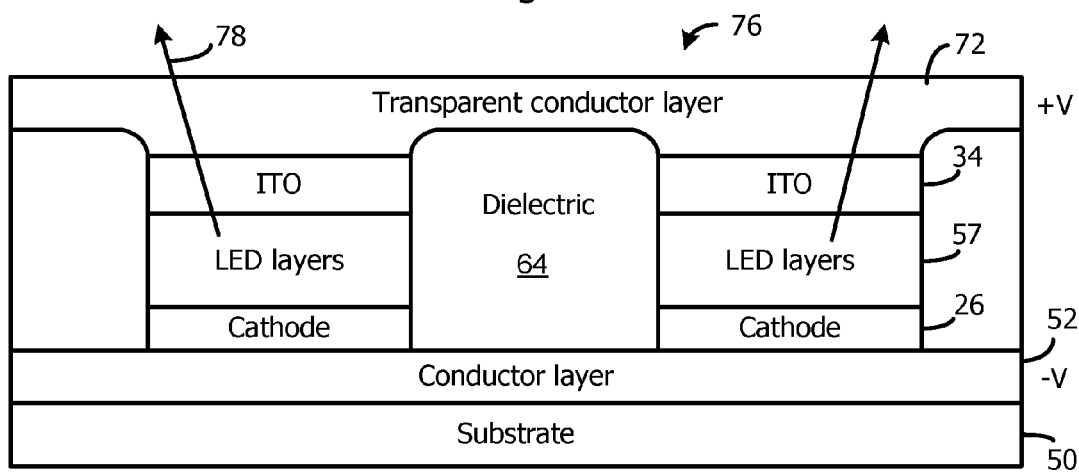
FIG. 6 illustrates the light sheet portion of FIG. 5 after the hydrophobic layer has been neutralized or removed and after a transparent conductor layer has been deposited over the exposed top surfaces of the LEDs to connect them in parallel.

In step 68, and as shown in FIG. 6, the hydrophobic layer 38 is neutralized or removed, such as by a brief blanket etch or by dissolving, to expose the underlying anode electrodes 34 (e.g., an ITO layer). In one embodiment, the thin hydrophobic layer 38 is naturally removed or neutralized after a time or during the curing of the dielectric material 64 by heat or UV.

In step 70, a top conductor layer 72 is deposited over the anode electrodes 34 and cured to electrically connect all the LED dies 56 in parallel. In one embodiment, the conductor layer 72 is a transparent conductor such as ITO or sintered silver nanowires.

A protective layer (not shown) may then be deposited over the conductor layer 72. A phosphor layer may be deposited to achieve any color. In one embodiment, the phosphor is YAG (yellow) and some blue LED light leaks through the phosphor to create white light.

The resulting light sheet 76 may be any size. For large sizes, thin metal bus lines may create a grid pattern to better distribute the driving voltage. Edges of the light sheet 76 may terminate in robust metal electrodes for connection to a driving voltage. FIG. 6 illustrates a driving voltage being applied to the conductor layers 52 and 72 to cause the LED dies to emit light 78 that exits through the top surface of the light sheet 76.

The resulting light sheet 76 is up to four times more efficient than the inventors' previous light sheets formed using the 30 micron LEDs of FIG. 1, and the smaller LEDs result in more LEDs per unit area to create a more uniform light across the light sheet 76.

This technique can also be used for forming an addressable array of printed LEDs. In such an embodiment, the LEDs are printed in an array of small groups as addressable pixels, and addressable XY conductors are energized to energize a pixel at the intersection of the energized conductors.

In one embodiment, the substrate 50 is removed from the light sheet structure to create a thinner and more flexible light sheet.

This technique can also be employed for creating more efficient micro-components that are printed and contacted by conductor layers, such as non-LED silicon diodes, 3-terminal transistors, etc.

The light sheet 76 can be used for general illumination, displays, backlights, indicator lights, etc.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. An illumination structure comprising:
   a bottom conductor layer;
   a plurality of vertical light emitting diodes (VLEDs), each of the VLEDs having a bottom electrode electrically contacting the bottom conductor layer, each of the VLEDs having a flat first transparent conductor layer forming a top electrode, with no opaque metal portions forming the top electrode;
   a second transparent conductor layer directly over and contacting the first transparent conductor layer of each of the VLEDs, with no opaque metal layer in-between, such that the plurality of VLEDs are electrically connected in parallel and light passes through the first transparent conductor layer and the second transparent conductor layer when the VLEDs are illuminated by a voltage differential between the second transparent conductor layer and the bottom conductor layer; and
   a dielectric material between the VLEDs and overlying the bottom conductor layer but not substantially covering the first transparent conductor layer, wherein the second transparent conductor layer overlies the dielectric layer.

2. The structure of claim 1 wherein the first transparent conductor layer comprises one of ITO or sintered silver nanowires.

3. The structure of claim 1 wherein the first transparent conductor layer covers an entire top semiconductor surface of each of the VLEDs.

4. The structure of claim 1 wherein the bottom conductor layer is reflective.

5. The structure of claim 1 wherein the bottom conductor layer is transparent.

6. The structure of claim 1 further comprising a flexible substrate on which the bottom conductor layer is formed.

7. The structure of claim 1 wherein the VLEDs are microscopic VLEDs printed as an ink over the bottom conductor layer.

8. The structure of claim 1 wherein a diameter of each of the VLEDs is 10 microns or less.

* * * * *